(12) United States Patent
Murakami (10) Patent No.: US 10,957,846 B2
(45) Date of Patent: Mar. 23, 2021

(54) MAGNETORESISTIVE EFFECT ELEMENT AND METHOD OF MANUFACTURING THE SAME

(71) Applicant: TOSHIBA MEMORY CORPORATION, Tokyo (JP)

(72) Inventor: Shuichi Murakami, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 361 days.

(21) Appl. No.: 15/916,964

(22) Filed: Mar. 9, 2018

(65) Prior Publication Data

US 2019/0088861 A1    Mar. 21, 2019

(30) Foreign Application Priority Data

Sep. 20, 2017    (JP) .............................. JP2017-180050

(51) Int. Cl.

| | | |
|---|---|---|
| *H01L 43/08* | (2006.01) | |
| *G11C 11/16* | (2006.01) | |
| *H01L 43/10* | (2006.01) | |
| *H01L 43/12* | (2006.01) | |

(52) U.S. Cl.

CPC ............ *H01L 43/08* (2013.01); *G11C 11/161* (2013.01); *H01L 43/10* (2013.01); *H01L 43/12* (2013.01)

(58) Field of Classification Search
CPC .......... H01L 43/08; H01L 43/10; H01L 43/12
See application file for complete search history.

(56) References Cited

U.S. PATENT DOCUMENTS

| 6,287,975 B1 | 9/2001 | DeOrnellas et al. |
| 8,703,619 B2 | 4/2014 | Araki et al. |
| 2009/0315045 A1 | 12/2009 | Horie |
| 2013/0240964 A1 | 9/2013 | Ozeki et al. |
| 2018/0097175 A1* | 4/2018 | Chuang .................. H01L 43/08 |

FOREIGN PATENT DOCUMENTS

| JP | 2500430 B2 | 5/1996 |
| JP | 2002510142 A | 4/2002 |
| JP | 2013149944 A | 8/2013 |
| JP | 2013197215 A | 9/2013 |
| JP | 2013207332 A | 10/2013 |

OTHER PUBLICATIONS

Toshiyuki Sasaki et al., "Highly selective etching of LaAlSiOx to Si using C4F8/Ar/H2 plasma," Japanese Journal of Applied Physics, 54, 2015, 06GB03-1 to 06GB03-5.

* cited by examiner

*Primary Examiner* — Errol V Fernandes
(74) *Attorney, Agent, or Firm* — Holtz, Holtz & Volek PC (57) ABSTRACT

According to one embodiment, a method of manufacturing a magnetoresistive-effect element includes: forming a second layer on a stack of layers, the stack of layers including a ferromagnetic layer and a first layer, the first layer comprising magnesium oxide, the second layer and magnesium oxide having a selected ratio larger than 1 to first etching by ion beams; and etching the stack of layers through the first etching with the second layer used as a mask.

10 Claims, 10 Drawing Sheets

MAGNETORESISTIVE EFFECT ELEMENT AND METHOD OF MANUFACTURING THE SAME

CROSS-REFERENCE TO RELATED APPLICATIONS

This application is based upon and claims the benefit of priority from Japanese Patent Application No. 2017-180050, filed Sep. 20, 2017, the entire contents of which are incorporated herein by reference.

FIELD

Embodiments relate generally to a magnetoresistive-effect element and a method of manufacturing the same.

BACKGROUND

Magnetoresistive-effect elements, which exhibit the magnetoresistive effect, are known. The magnetoresistive effect is a phenomenon in which a magnetoresistive-effect element exhibits different resistances when respective magnetization directions of two ferromagnets are parallel and anti-parallel.

DETAILED DESCRIPTION

In general, according to one embodiment, a method of manufacturing a magnetoresistive-effect element includes: forming a second layer on a stack of layers, the stack of layers including a ferromagnetic layer and a first layer, the first layer comprising magnesium oxide, the second layer and magnesium oxide having a selected ratio larger than 1 to first etching by ion beams; and etching the stack of layers through the first etching with the second layer used as a mask.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. Moreover, the figures may include components which differ in relations and/or ratios of dimensions in different figures. Each embodiment illustrates the device and method for materializing the technical idea of that embodiment, and the technical idea of an embodiment does not specify the quality of the material, shape, structure, arrangement of components, etc. to the following.

Figure 1:
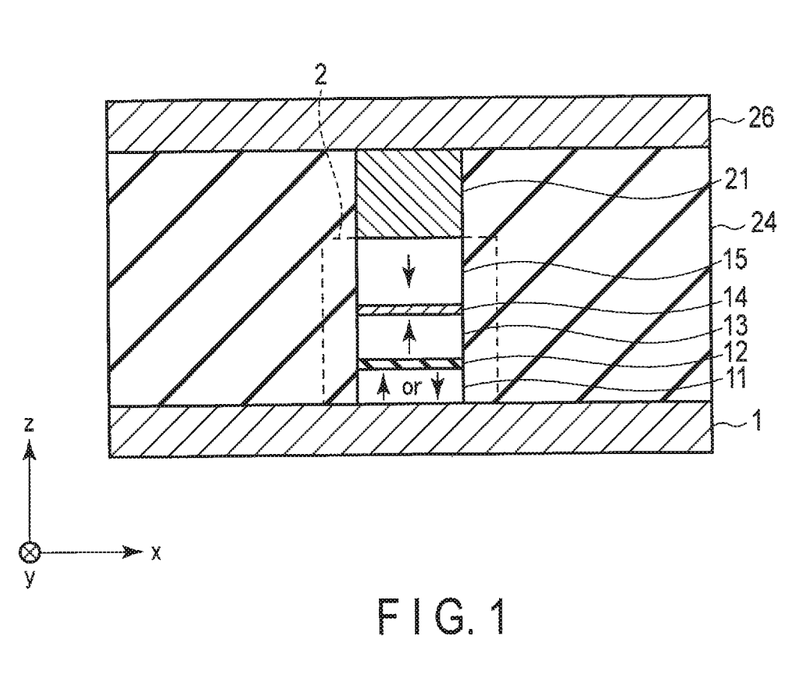
FIG. 1 illustrates a cross-sectional structure of a part of a magnetoresistive memory device of one embodiment.

FIG. 1 illustrates a cross-sectional structure of a part of a magnetoresistive memory device of one embodiment. As illustrated in FIG. 1, a magnetic tunnel junction (MTJ) element 2 is disposed on the conductor 1. The conductor 1 may be an electrode above a silicon substrate (not shown), or may be a portion of a silicon substrate with impurities introduced therein.

The MTJ element 2 has a shape of a substantial circle along the xy-plane, for example. The MTJ element 2 includes at least a ferromagnet 11, a nonmagnet 12, and a ferromagnet 13. The nonmagnet 12 is located between the ferromagnets 11 and 13, and, for example, is in contact with the ferromagnets 11 and 13 between the ferromagnets 11 and 13. Any of the ferromagnets 11 and 13 may be located lower. The ferromagnet 11, the nonmagnet 12, and the ferromagnet 13 are stacked along the z-axis.

The ferromagnet 11 includes or is made of one or more conductive ferromagnetic elements. Specifically, the ferromagnet 11 includes one or more of iron (Fe), boron (B), and cobalt (Co), and includes, for example, cobalt iron boron (CoFeB) or boride iron (FeB). Alternatively, the ferromagnet 11 includes or is made of an alloy of two or more elements of Co, Fe, and B. The ferromagnet 11 is magnetized in the direction along a particular axis, and has a magnetization easy axis along an axis which penetrates the boundaries of the ferromagnet 11, the nonmagnet 12, and the ferromagnet 13, such as the-axis. The direction of the magnetization of the ferromagnet 11 can be switched by a current (write current) which flows through the ferromagnet 11, the nonmagnet 12, and the ferromagnet 13. The ferromagnet 11 may be generally referred to as a storage layer, etc.

The nonmagnet 12 includes or is made of one or more nonmagnetic insulative elements, and serves as a tunnel barrier. For example, the nonmagnet 12 includes or is made of magnesium oxide (MgO).

The ferromagnet 13 includes or is made of one or more conductive ferromagnetic elements. For example, the ferromagnet 13 includes or is made of cobalt platinum (CoPt), cobalt nickel (CoNi), or cobalt palladium (CoPd). The ferromagnet 13 may also include a stack of two or more layers that respectively includes different ones of cobalt (Co), platinum (Pt), palladium (Pd), and nickel (Ni), or the alloy of two or more of these elements. The ferromagnet 13 has the magnetization easy axis along an axis which penetrates the boundaries of the ferromagnet 11, the nonmagnet 12, and the ferromagnet 13. The ferromagnet 13 has a magnetization with a fixed or invariable direction, and has a larger coercivity than that of the ferromagnet 11, for example. The magnetization direction of the ferromagnet 13 being "fixed" or "invariable" refers to the magnetization direction of the ferromagnet 13 not being switched by a write current of a magnitude that switches the magnetization direction of the ferromagnet 11. The ferromagnet 13 may be generally referred to as a reference layer, etc.

The set of the ferromagnet 11, the nonmagnet 12, and the ferromagnet 13 exhibits the magnetoresistive effect. Specifically, the MTJ element 2 exhibits the minimum and maximum resistances when the magnetization direction of the ferromagnet 11 is parallel and antiparalell with the magnetization direction of the ferromagnet 13, respectively.

The MTJ element 2 may include an additional layer. The details of layers included in the MTJ element 2 do not limit the embodiments. By way of example only, the MTJ element 2 includes a conductor 14 and a ferromagnet 15, and the figures and the following description are based on such an example. The conductor 14 is located on the ferromagnet 13, and the ferromagnet 15 is located on the conductor 14. The conductor 14 has a function to antiferromagnetically couple the ferromagnets 13 and 15, and includes or is made of ruthenium (Ru), for example. The ferromagnet 15 has a function to suppress or offset a magnetic field that is generated by the ferromagnet 13 and applied to the ferromagnet 11, or a stray magnetic field.

A tantalum layer 21 is disposed on the top of the MTJ element 2. The tantalum layer 21 includes tantalum, and, for example, is substantially made of tantalum. The term "substantially" is herein intended to represent that the tantalum layer 21 is made of tantalum, but it contains unintentionally introduced impurities.

Figure 2:
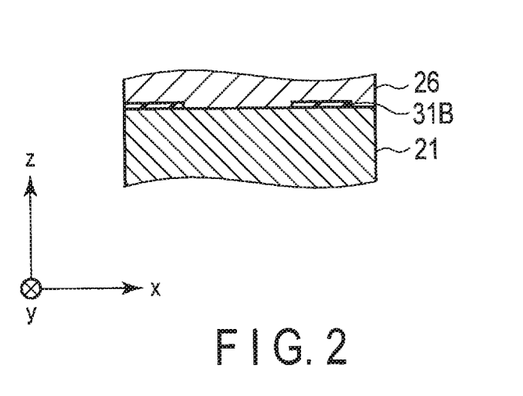
FIG. 2 illustrates a magnified view of a cross-sectional structure of a part of the magnetoresistive memory device of the embodiment.

As illustrated in FIG. 2, a part 31B of a hard mask 31A may partially remain on the tantalum layer 21 unintentionally. The hard mask 31A will be described in full detail below.

An insulator 24 is disposed around the MTJ element 2. An electrode 26 is disposed on the tantalum layer 21.

Figure 3:
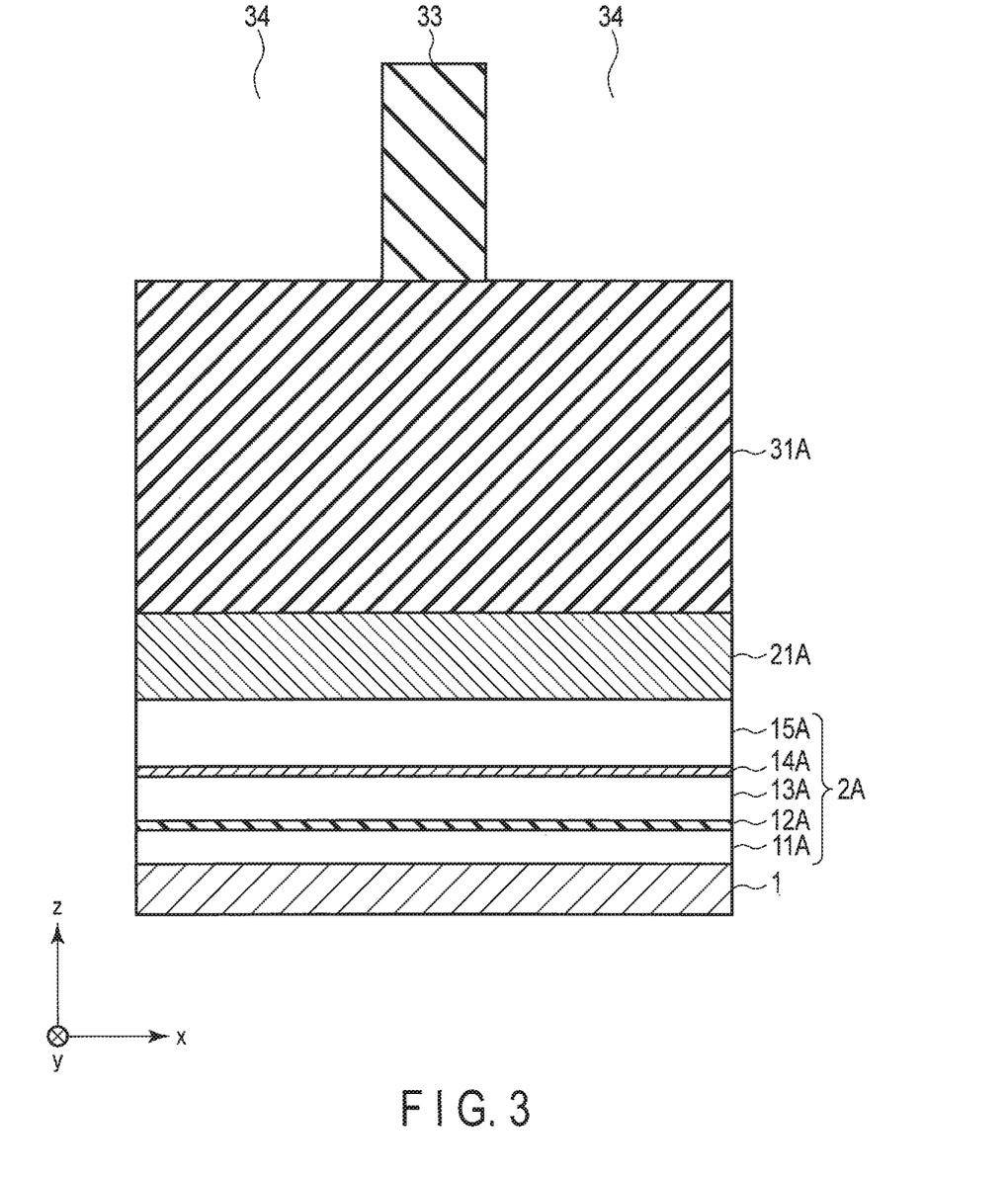
FIG. 3 illustrates one state in a manufacturing process of the magnetoresistive memory device of the embodiment.

Referring to FIGS. 3 to 7, a manufacturing method of the structure of FIG. 1 will be described. As illustrated in FIG. 3, a stack of to-be-processed layers 2A is deposited on the conductor 1. The stack of layers 2A is a stack of to-be-processed layers that will be partially removed through etching to be processed into layers included in the MTJ element 2. Specifically, in an example of the MTJ element 2 made of the ferromagnet 11, the nonmagnet 12, the ferromagnet 13, the conductor 14, and the ferromagnet 15, the stack of layers 2A includes a ferromagnet 11A, a nonmagnet 12A, a ferromagnet 13A, a conductor 14A, and a ferromagnet 15A. The ferromagnet 11A, the nonmagnet 12A, the ferromagnet 13A, the conductor 14A, and the ferromagnet 15A are stacked in this order along the z-axis, and are layers to be etched into the ferromagnet 11, the nonmagnet 12, the ferromagnet 13, the conductor 14, and the ferromagnet 15, respectively. For a case of the MTJ element 2 including one or more additional layers, the stack of layers includes one or more additional to-be-processed layers that will be respectively processed into the additional layers.

A tantalum layer 21A is formed on the stack of layers 2A. The tantalum layer 21A is a layer part of which will be removed through etching to be processed into the tantalum layer 21.

A hard mask 31A is formed on the stack of layers 2A. The hard mask 31A has one or more of the features described in the following.

The hard mask 31A is a conductor. The hard mask 31A is removed after being used in a subsequent process, and it is desirable that the hard mask 31A is removed completely. The hard mask 31A may, however, not be completely removed depending on the characteristics of the material of the hard mask 31A, and the details of etching. It is desirable that the hard mask 31A can send a current through the hard mask 31A even in such a case.

The hard mask 31A has a high hardness. The hard mask 31A is used as a mask during subsequent physical etching of the stack of layers 2A and the tantalum layer 21A into the MTJ element 2 and the tantalum layer 21, respectively. To this end, the hard mask 31A is formed into a hard mask pattern 31 with a plane shape corresponding to the shape along the xy-plane (plane shape) of the MTJ element 2, and the stack of layers 2A and the tantalum layer 21A are etched through the hard mask pattern 31. In order to form the MTJ element 2 with a small plane shape for improving the density of components in the magnetoresistive memory device, the hard mask pattern 31 also has a small plane shape. On the other hand, the physical etching lowers the top of the hard mask pattern 31, and therefore the hard mask pattern 31 needs to have a certain thickness to avoid the hard mask pattern 31 from being etched off from its top and the tantalum layer 21A from being exposed. Because of such requests, the hard mask pattern 31 has a high aspect ratio. The hard mask pattern 31 with a very high aspect ratio can fall down due to its own weight or other factors during the etching. In order to reduce such a possibility, the hard mask 31A has a high hardness. Moreover, the harder the hard mask 31, the higher the resistance of the hard mask 31 against the physical etching. From this perspective, the hard mask 31 has a high hardness.

A material with a high hardness is, for example, a material harder than MgO. The hardest target film in the physical etching with the hard mask pattern 31 is MgO used for the nonmagnet 12. For this reason, the hard mask 31 needs to have a resistance to the etching for forming the stack of layers 2A, in particular MgO. Therefore, the material for the hard mask 31 needs to be harder than MgO, and is a material to allow the etching for forming MgO to have an etch selection ratio larger than 1 with MgO. As a hard material for the hard mask 31, a compound can be used, for example.

Figure 4:
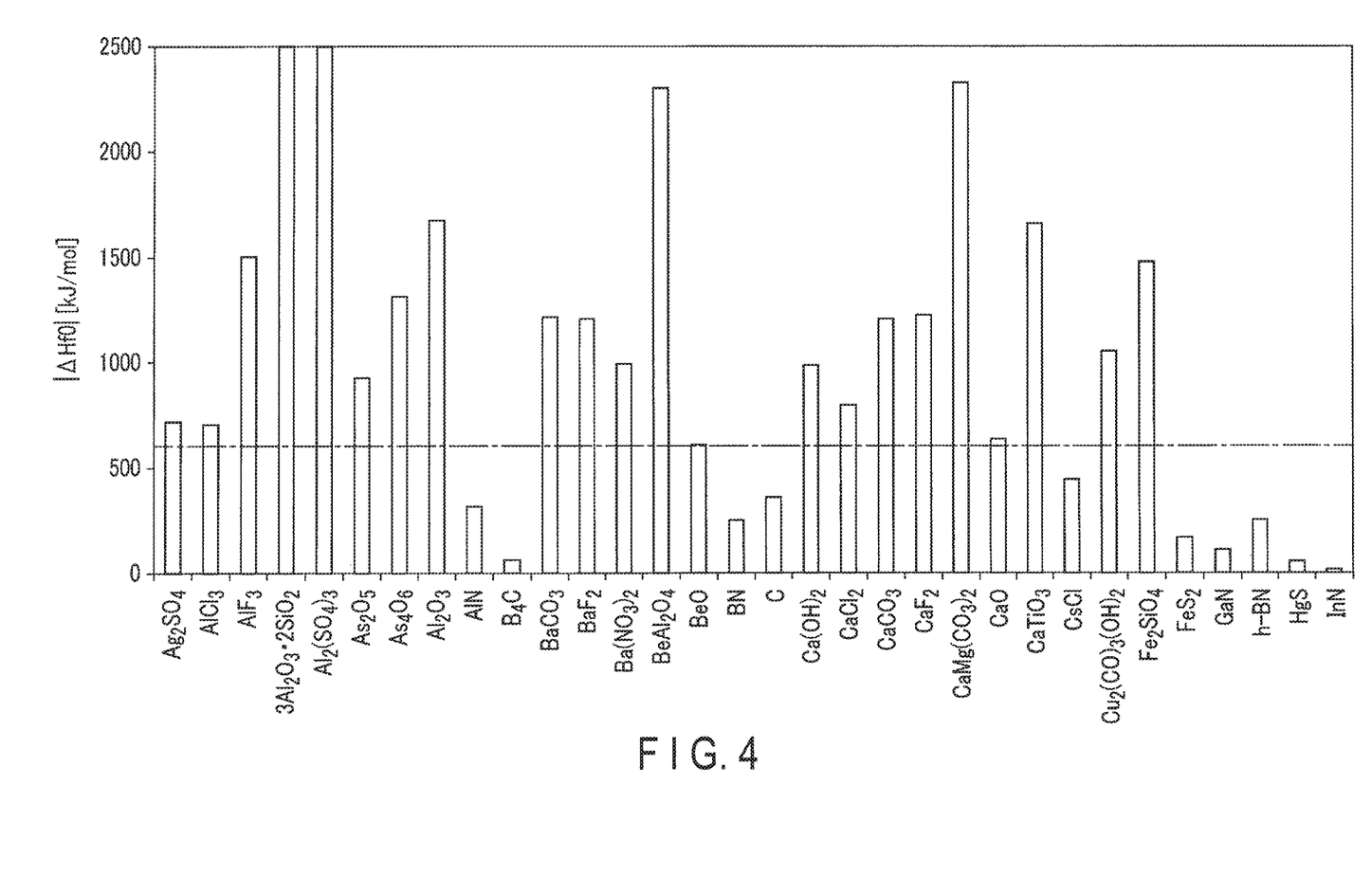
FIG. 4 illustrates absolute values of standard enthalpy of formation of materials.
Figure 5:
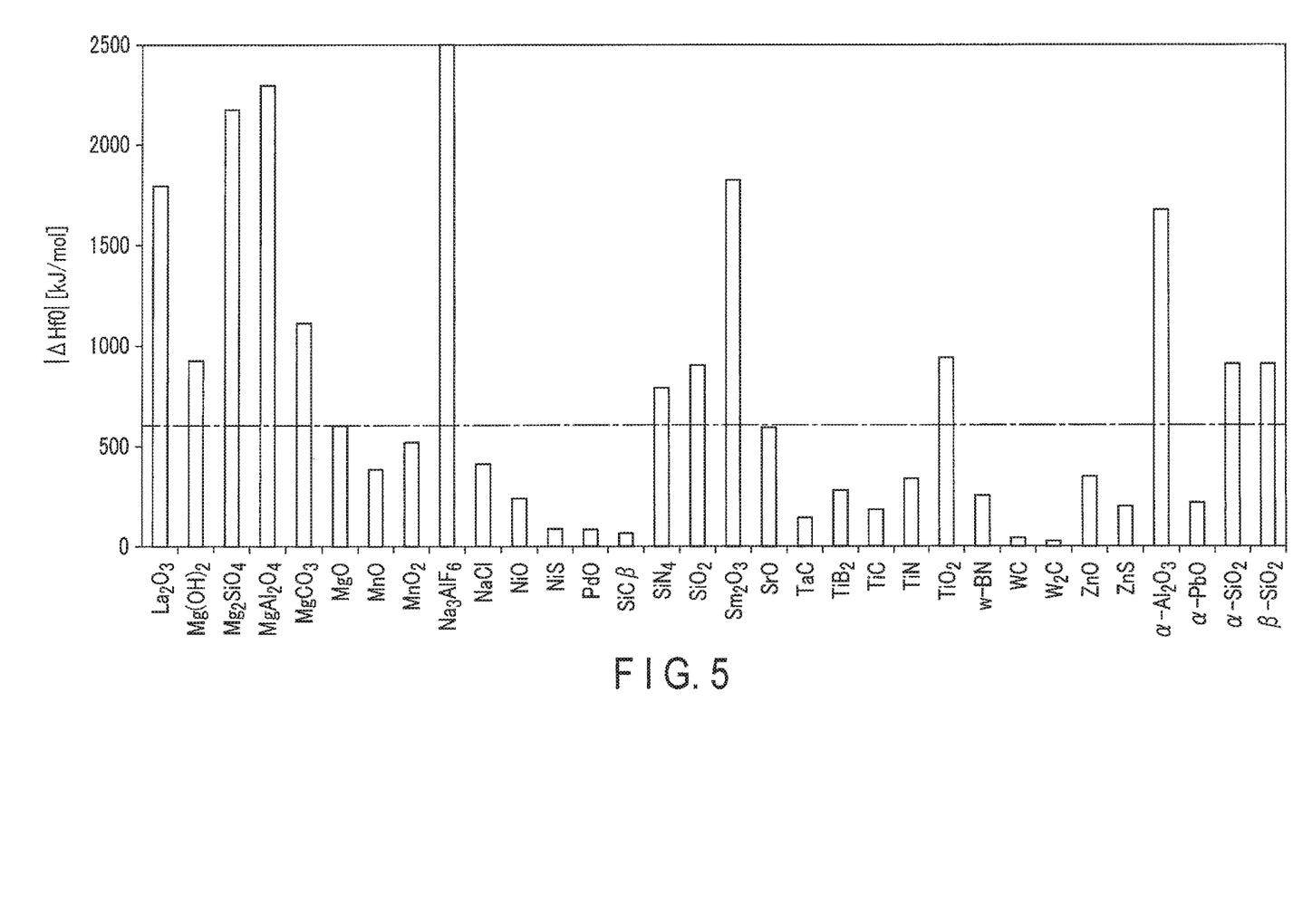
FIG. 5 illustrates absolute values of standard enthalpy of formation of other materials.

Moreover, it is known that a material with a high absolute value of standard enthalpy of formation (|[Δ]fH0|) or a high bonding energy has a high hardness. FIGS. 4 and 5 illustrate the absolute values of the standard enthalpy of formation of various materials. In general, materials that have been actually used as or studied for the possibility as a material of the hard mask for the physical etching of MTJ elements include aluminum nitride (AlN), boron carbide ($B_4C$), boron nitride (BN), carbon (C), gallium nitride (GaN), indium nitride (InN), silicon carbide (SiCβ), tantalum carbide (TaC), titanium boride ($TiB_2$), titanium carbide (TiC), titanium nitride (TiN), etc. Those materials have only absolute values of standard enthalpies of formation lower than the absolute value of the standard enthalpy of formation of MgO.

FIGS. 4 and 5 also illustrate the absolute values of standard enthalpies of formation other than those materials, and illustrate the absolute values of standard enthalpies of formation of silver sulfate (I) ($Ag_2SO_4$), aluminum chloride ($AlCl_3$), aluminum fluoride ($AlF_3$), mullite ($3Al_2O_3.2SiO_2$), aluminum sulfate ($A_2(SO_4)_3$), arsenic pentoxide ($As_2O_5$), arsenic trioxide ($As_4O_6$), aluminum oxide ($Al_2O_3$), witherite (poison weight) ($BaCO_3$), barium fluoride ($BaF_2$), barium nitrate ($Ba(NO_3)_2$), alexandrite ($BeAl_2O_4$), beryllium oxide (BeO), calcium hydroxide ($Ca(OH)_2$), a calcium chloride ($CaCl_2$), calcite ($CaCO_3$), fluorite ($CaF_2$), dolomite ($CaMg(CO_3)_2$), calcium oxide (CaO), perovskite ($CaTiO_3$), cesium chloride (CsCl), malachite ($Cu_2(CO)_3(OH)_2$), fayalite ($Fe_2SiO_4$), pyrite ($FeS_2$), hexagonal boron nitride (h-BN), cinnabar (HgS), lanthanum oxide ($La_2O_3$), magnesium hydroxide ($Mg(OH)_2$), forsterite ($Mg_2SiO_4$), spinel ($MgAl_2O_4$), magnesite ($MgCO_3$), magnesium oxide (MgO), manganese oxide (II) (MnO), manganese dioxide, manganese oxide (IV) ($MnO_2$), cryolite ($Na_3AlF_6$), sodium chloride (NaCl), nickel oxide (NiO), millerite (NiS), palladium oxide (PdO), silicon nitride ($SiN_4$), β2-tridiymite ($SiO_2$), samarium oxide ($Sm_2O_3$), strontium oxide (SrO), rutile ($TiO_2$), wurtzite boron nitride (w-BN), tungsten carbide ($W_2C$, WC), zinc oxide (ZnO), sphalerite (ZnS), corundum (α-Al$_2$O$_3$), lead oxide (litharge) (α-PbO), crystal (α-quartz) (α-SiO$_2$), and β-quartz (β-SiO$_2$). As can be seen from FIGS. 4 and 5, among those materials, silver sulfate (I), aluminum chloride, aluminum fluoride, mullite, aluminum sulfate, arsenic pentoxide, arsenic trioxide, aluminum oxide, witherite, barium fluoride, barium nitrate, alexandrite, calcium hydroxide, calcium chloride, calcite, fluorite, dolomite, calcium oxide, perovskite, malachite, fayalite, lanthanum oxide, magnesium hydroxide, forsterite, spinel, magnesite, cryolite, silicon nitride, β2-tridiymite, samarium oxide, and rutile have absolute values of standard enthalpies of formation higher than that of MgO (illustrated by the alternate long and short dash line). Therefore, the material for the hard mask 31 can include silver sulfate (I), an aluminum chloride, aluminum fluoride, mullite, aluminum sulfate, arsenic pentoxide, arsenic trioxide, aluminum oxide, witherite, barium fluoride, barium nitrate, alexandrite, calcium hydroxide, calcium chloride, calcite, fluorite, dolomite, calcium oxide, perovskite, malachite, fayalite, lanthanum oxide, magnesium hydroxide, forsterite, spinel, magnesite, cryolite, silicon nitride, β2-tridiymite, samarium oxide, and rutile.

The hard mask 31 may have crystallinity. In general, it is known that many hard materials are crystalline and the hard mask 31 of a high hardness has crystallinity. For example, the material for the hard mask 31 is a material that can grow epitaxially on the tantalum layer 21A, and a material that can be formed by the lattice strain of 4% or less, for example.

The material for the hard mask 31 may be a material with a high affinity with tantalum, in other words a material that easily crystallizes on tantalum. This is because materials that easily crystallize tend to have a high hardness, and the hard mask 31 is formed on the tantalum layer 21A, as described above. The material for the hard mask 31 has a high hardness if it is lattice-matched; however it is not necessarily lattice-matched, but it only needs to have a high hardness.

Referring back FIG. 3, a photoresist 33 is formed on the hard mask 31A after the formation of the hard mask 31A. The photoresist 33 remains above an area in which the MTJ element 2 will be formed and has, in the remaining portions, openings 34 that reach the bottom of the photoresist 34.

Figure 6:
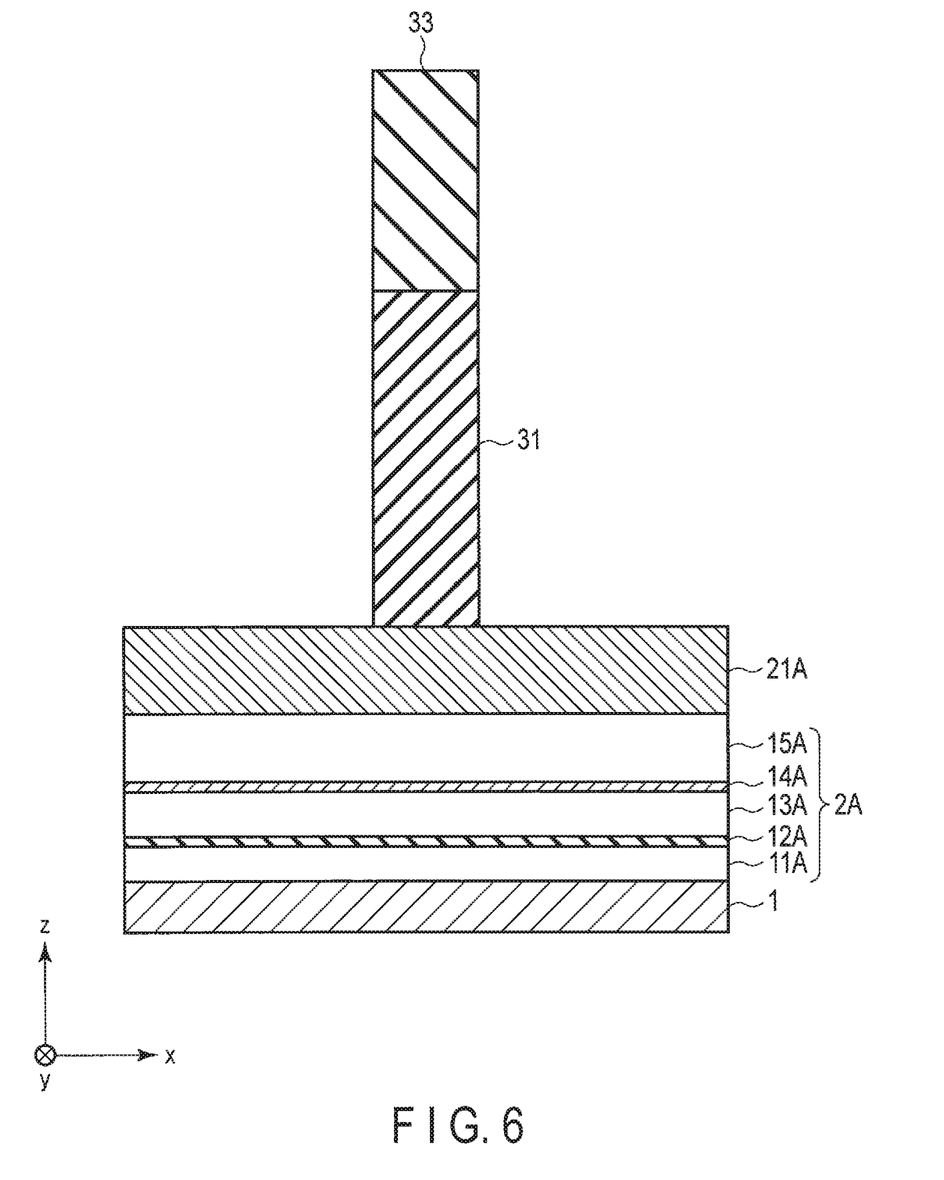
FIG. 6 illustrates the state subsequent to FIG. 3.

As illustrated in FIG. 6, the photoresist 33 is used as a mask and the hard mask 31 is etched. As a result, a hard mask pattern 31 is formed from the hard mask 31. The hard mask pattern 31 is located above an area in which the MTJ element 2 will be formed, has a plane shape corresponding to or substantially the same plane shape of the to-be-formed MTJ element 2, and has an independent and/or isolated plane shape. The hard mask pattern 31 has a high aspect ratio due to the MTJ element 2 having a small plane shape and the hard mask pattern 31 having a thickness to prevent the following physical etching from etching off the hard mask pattern from its top. The photoresist 33 is then removed.

Figure 7:
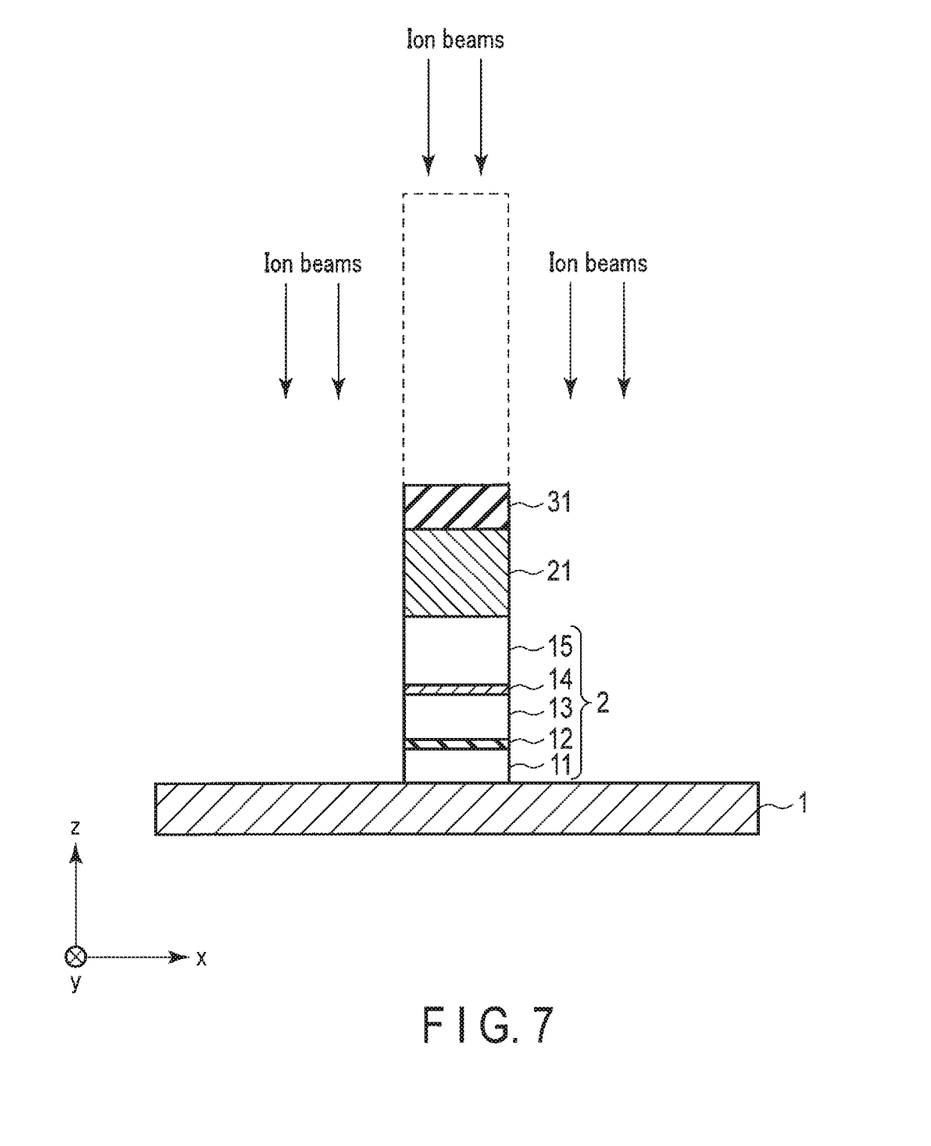
FIG. 7 illustrates the state subsequent to FIG. 6.

As illustrated in FIG. 7, the hard mask pattern 31 is used as a mask, and the stack of layers 2A and the tantalum layer 21A is physically etched through ion beam etching (IBE). The IBE is generally performed in an atmosphere of rare gas, and, for example, in gas containing one or more of argon (Ar), neon (Ne), krypton (Kr), and xenon (Xe). The stack of layers 2A and the tantalum layer 21A are patterned by the physical etching, thereby the MTJ element 2 and the tantalum layer 21 are formed. The etching lowers the top of the hard mask pattern 31 somewhat. The hard mask pattern 31 is then removed by wet or dry etching, for example.

An insulator 24 is then formed in the surroundings of the MTJ element 2 and the electrode 26 is formed on the insulator 24 and the tantalum layer 21 afterwards, thereby the structure of FIG. 1 is obtained.

According to the embodiment, the MTJ element 2 with a small diameter can be formed. The details are as follows.

As described above, a diameter of an MTJ element is desirably smaller for improved integration of magnetoresistive memory devices. The smaller the diameter of an MTJ element, the smaller the diameter of the pattern of a hard mask used to etch a stack of layers into the MTJ element. On the other hand, with physical etching, such as the IBE, used to etch the stack of layers, the hard mask pattern needs to be thick to prevent the physical etching from etching off the hard mask pattern. In particular, with conventional materials used for the hard mask, the hard mask pattern needs to be considerably thick due to their low hardness. Thus, an increasingly high aspect ratio is required for the hard mask pattern in order to have a small diameter and a large thickness.

The higher the aspect ratio of the hard mask pattern, the lower the instability thereof, which makes it fall down easily. For improved stability of the hard mask pattern to prevent it from falling down, the aspect ratio of the hard mask pattern needs to be reduced. Thus, the aspect ratio of the hard mask pattern needs to be high to keep it from being etched off and to make a small MTJ element, whereas it needs to be low to suppress the collapse of the hard mask pattern. Therefore, the advance of reduction of the diameter of the MTJ elements is limited by the maximum aspect ratio for the hard mask patterns. In fact, with the materials that realize the hard mask patterns of diameters so far without falling down, a hard mask pattern of a smaller diameter cannot be formed without falling down.

The description so far relates to a structure where the ferromagnet 11 with switchable magnetization direction is located under the ferromagnet 13, or a structure where the ferromagnet 11, the nonmagnet 12, the ferromagnet 13, the conductor 14, and the ferromagnet 15 are stacked in this order on the conductor 1. The embodiment, however, is applicable to a structure where the ferromagnet 15, the conductor 14, the ferromagnet 13, the nonmagnet 12, and the ferromagnet 11 are stacked in this order on the conductor 1, as illustrated in FIG. 8.

Figure 8:
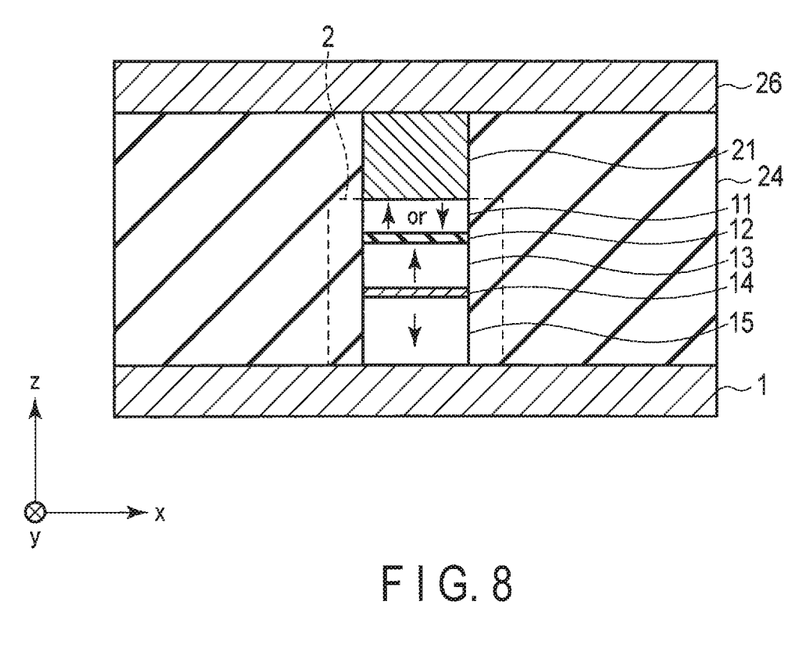
FIG. 8 illustrates a cross-sectional structure of a part of a magnetoresistive memory device of a modification of the embodiment.
Figure 9:
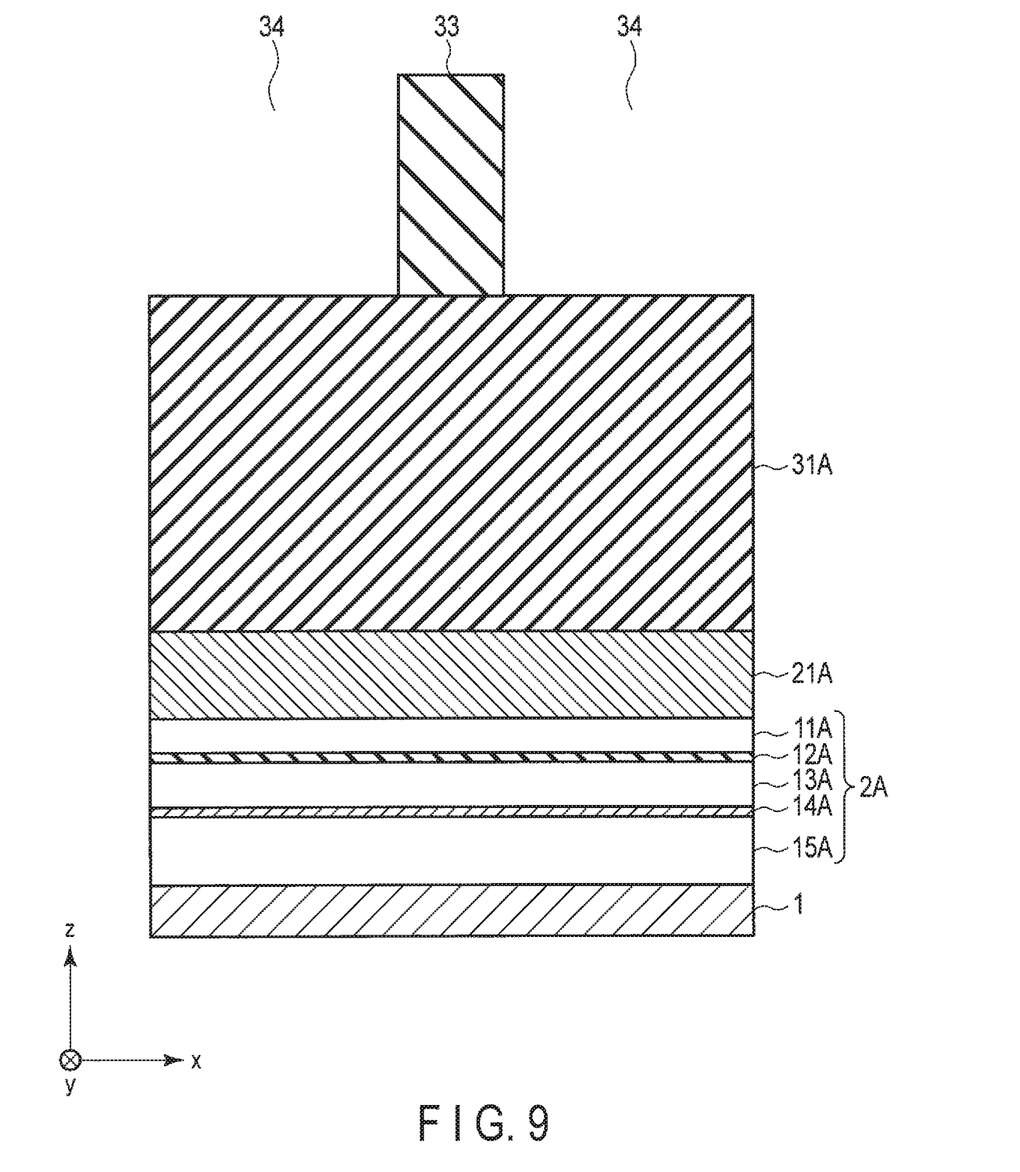
FIG. 9 illustrates one state in a manufacturing process of the magnetoresistive memory device of the modification of the embodiment.
Figure 10:
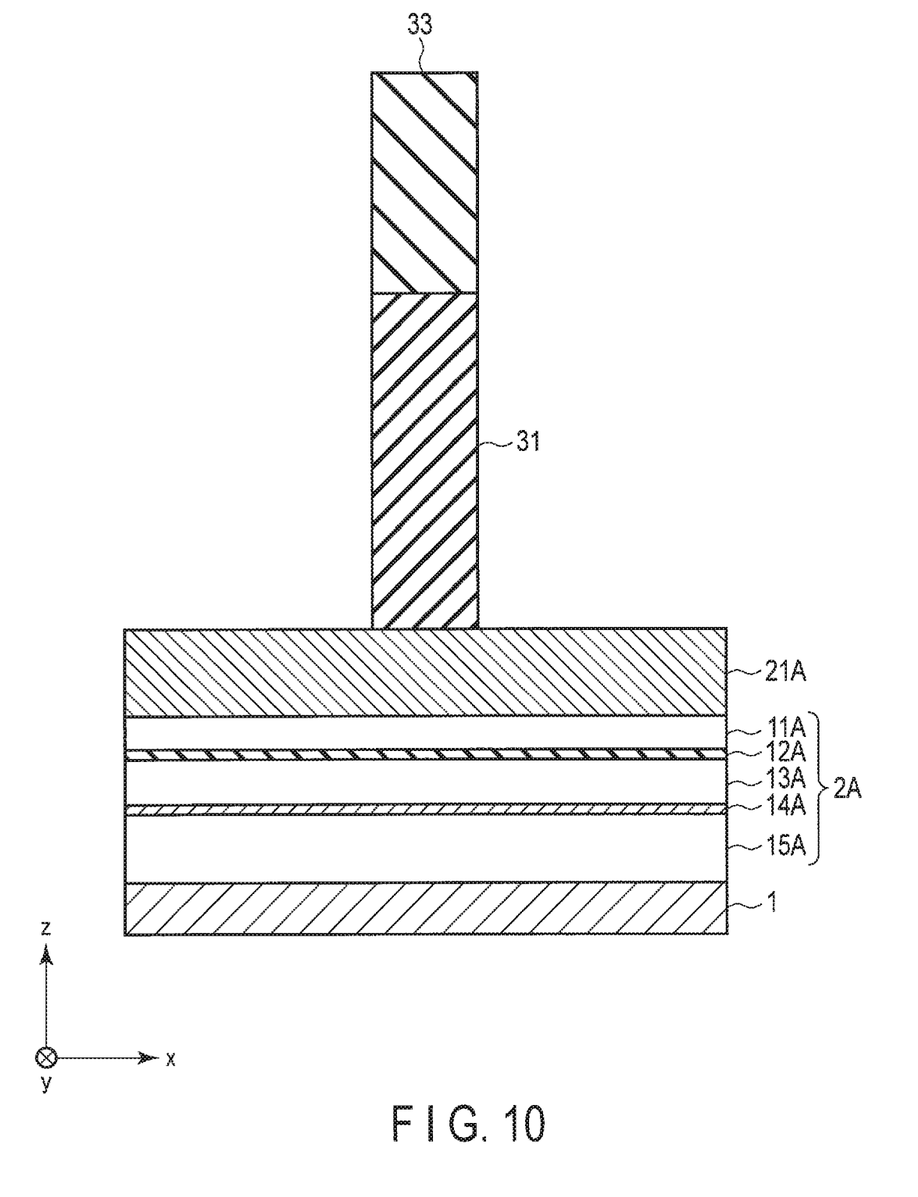
FIG. 10 illustrates the state subsequent to FIG. 9.
Figure 11:
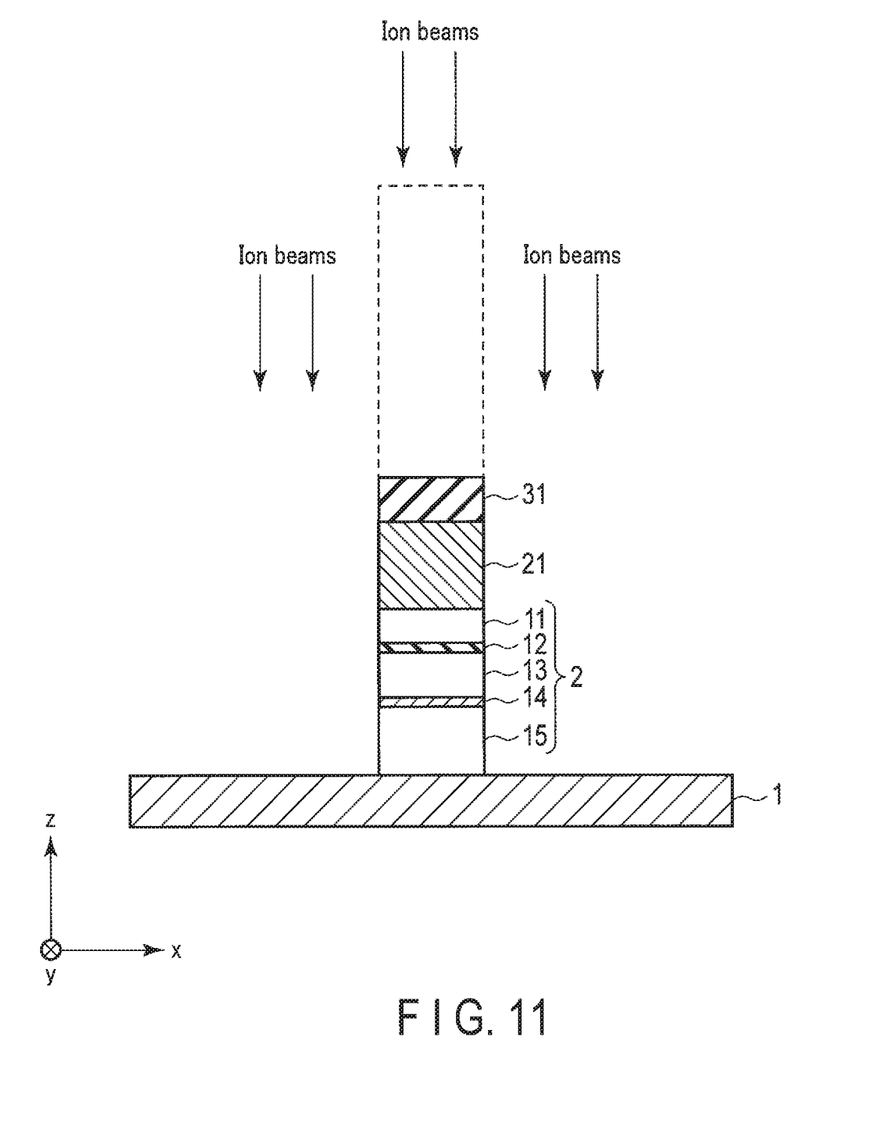
FIG. 11 illustrates the state subsequent to FIG. 10.

The structure of FIG. 8 can be formed through the process of FIGS. 9 to 11. FIGS. 9 to 11 respectively correspond to FIG. 3, FIG. 6, and FIG. 7, respectively differ from FIG. 3, FIG. 6, and FIG. 7 in the order of layers in the stack of layers 2A and the order of the layers in the MTJ element 2, and are applied with descriptions for FIG. 3, FIG. 6, and FIG. 7 for the remaining features.

According to the embodiment, for the hard mask pattern 31 used in physical etching for forming the MTJ element 2, a compound with an aspect ratio with MgO larger than one to the physical etching is used. Therefore, the hard mask pattern 31 has a higher resistivity against the physical etching than materials conventionally used and MgO. This allows the hard mask pattern 31 to be thinner, for a particular diameter, than that of conventional materials, which is necessary to keep it from falling down. Therefore, the hard mask pattern 31 can have a significantly small diameter that would result in a high aspect ratio with which the hard mask pattern 31 would otherwise easily fall down. This enables formation of the MTJ element 2 of a small diameter that is unrealizable with the conventional materials.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a magnetoresistive-effect element, the method comprising:
   forming a second layer on a stack of layers, the stack of layers including a ferromagnetic layer and a first layer, the first layer comprising magnesium oxide, and the second layer and magnesium oxide having a selected ratio larger than 1 to first etching by ion beams; and
   etching the stack of layers through the first etching with the second layer used as a mask,
   wherein the second layer comprises at least one of silver sulfate (I), an aluminum chloride, aluminum fluoride, mullite, aluminum sulfate, an arsenic pentoxide, arsenic trioxide, an aluminum oxide, a witherite, barium fluoride, barium nitrate, alexandrite, calcium hydroxide, a calcium chloride, calcite, fluorite, dolomite, a calcium oxide, perovskite, malachite, a fayalite, lanthanum oxide, magnesium hydroxide, a forsterite, spinel, magnesite, a cryolite, a beta2-tridiymite, samarium oxide, and rutile.

2. The method according to claim 1, wherein:
   the second layer has a pattern isolated when the etching is started.

3. The method according to claim 1, wherein:
   the second layer comprises a crystalline compound.

4. The method according to claim 1, wherein:
   the stack of layers further includes a metal layer, and the second layer is formed on the metal layer.

5. The method according to claim 4, wherein:
   the metal layer contains tantalum, and
   the second layer comprises a crystalline compound.

6. The method according to claim 2, wherein:
   the second layer comprises a crystalline compound.

7. The method according to claim 2, wherein:
   the stack of layers further includes a metal layer, and the second layer is formed on the metal layer.

8. The method according to claim 7, wherein:
   the metal layer contains tantalum, and
   the second layer comprises a crystalline compound.

9. The method according to claim 3, wherein:
   the stack of layers further includes a metal layer, and the second layer is formed on the metal layer.

10. The method according to claim 9, wherein:
    the metal layer contains tantalum, and
    the second layer comprises a crystalline compound.

* * * * *